United States Patent
Fukuda

(10) Patent No.: US 8,362,610 B2
(45) Date of Patent: Jan. 29, 2013

(54) MOUNTING CONFIGURATION OF ELECTRONIC COMPONENT

(75) Inventor: Kenji Fukuda, Tokyo (JP)

(73) Assignee: NEC Corporation, Tokyo (JP)

( * ) Notice: Subject to any disclaimer, the term of this patent is extended or adjusted under 35 U.S.C. 154(b) by 114 days.

(21) Appl. No.: 12/043,468

(22) Filed: Mar. 6, 2008

(65) Prior Publication Data

US 2008/0217770 A1   Sep. 11, 2008

(30) Foreign Application Priority Data

Mar. 9, 2007   (JP) .................................. 2007-061018

(51) Int. Cl.
H01L 23/52   (2006.01)
(52) U.S. Cl. .. 257/737; 257/711; 257/731; 257/E23.023
(58) Field of Classification Search .................. 257/737, 257/711, 731, E23.023
See application file for complete search history.

(56) References Cited

U.S. PATENT DOCUMENTS

| 2006/0060959 A1* | 3/2006 | Hayashi et al. ............... 257/697 |
| 2007/0145379 A1* | 6/2007 | Eliashevich et al. ............ 257/79 |

FOREIGN PATENT DOCUMENTS

| JP | 03-16327 | | 2/1991 |
| JP | 0316327 | * | 2/1991 |
| JP | 10-4125 | | 1/1998 |
| JP | 2000-124259 A | | 4/2000 |
| JP | 2001-176928 A | | 6/2001 |
| JP | 2002-246404 | | 8/2002 |
| JP | 2002-270723 | | 9/2002 |
| JP | 2004-047758 A | | 2/2004 |
| JP | 2004-047758 | * | 12/2004 |
| JP | 2005-012065 A | | 1/2005 |
| JP | 2005-243913 | | 9/2005 |
| JP | 2006-216942 A | | 8/2006 |

* cited by examiner

Primary Examiner — Julio J Maldonado
Assistant Examiner — Hajar Kolahdouzan
(74) Attorney, Agent, or Firm — Dickstein Shapiro LLP

(57) ABSTRACT

An electronic component mounting configuration in which an electronic component chip having a plurality of protrusion-shaped electrodes distributed on its entire mounting surface is mounted through protrusion-shaped electrodes on a printed circuit board is provided which is capable of improving reliability of an electronic component by relieving thermal stress. The solder bumps are arranged so that intervals between solder bumps adjacent to one another become smaller from a central portion of a mounting surface of the electronic component chip toward the peripheral portion thereof. For example, an interval between the solder bump "1A" arranged in the central portion of the semiconductor chip and the solder bump "1B" arranged in an outer side thereof, adjacent to each other, is set to a pitch of P1. An interval between the solder bump "1B" and the solder bump "1C" formed arranged in an outer side thereof, adjacent to each other, is set to a pitch of P2 and an interval between the solder bump "1C" and the solder bump "1D" formed arranged in an outer side thereof, adjacent to each other, is set to a pitch of P3 (P1>P2>P3).

4 Claims, 8 Drawing Sheets

10; Electronic Component Mounting Configuration

1; Solder Bump
2; Semiconductor Chip
3; Printed Circuit Board

MOUNTING CONFIGURATION OF ELECTRONIC COMPONENT

INCORPORATION BY REFERENCE

This application is based upon and claims the benefit of priority from Japanese Patent Application No. 2007-061018, filed on Mar. 9, 2007, the disclosure of which is incorporated herein in its entirely by reference.

BACKGROUND OF THE INVENTION

1. Field of the Invention

The present invention relates to a mounting configuration of an electronic component and more particularly to the electronic component mounting configuration in which an electronic component chip having a plurality of protrusion-shaped electrodes arranged so as to be distributed on an entire mounting surface of the electronic component chip is mounted through protrusion-shaped electrodes onto a printed circuit board.

2. Description of the Related Art

In an integrated circuit being representative of an electronic component embedded in various electronic devices, when a semiconductor chip is mounted onto a printed circuit board, in order to meet the need for higher functionality and miniaturization of electronic devices, it is desirable that the semiconductor chip is electrically and mechanically connected to the printed circuit board in a state where more electrode terminals are integrated on a smaller-area mounting surface of the semiconductor chip. To satisfy such a requirement, a mounting configuration of the integrated circuit employing a flip chip method is disclosed in which the semiconductor chip is mounted by arranging protrusion-shaped electrodes made up of solder bumps serving as electrode terminals on an entire mounting surface of the semiconductor chip, instead of arranging the protrusion-shaped electrodes only in portions surrounding the mounting surface of the semiconductor chip.

FIGS. 5A and 5B are diagrams showing a related mounting configuration of an electronic component using the flip chip method; FIG. 5A is a plan view schematically showing configurations of a rear surface of a semiconductor chip and FIG. 5B is a cross-sectional view showing the mounting configuration of FIG. 5A taken along a line B-B. In the electronic component mounting configuration, as shown in FIGS. 5A and 5B, the semiconductor chip 102 in which a plurality of solder bumps (protrusion-shaped electrodes) 101 is arranged in two-dimensional directions (X and Y directions) at equal intervals with a pitch of "P" so as to be distributed on an entire mounting surface of the semiconductor chip 102 electrically and mechanically connected through solder bumps 101 to a printed circuit board 103.

However, in the related electronic component mounting configuration 100 as shown above, the semiconductor chip 102, while an electronic device having an embedded electronic component is operating, generates heat, which is transferred through the solder bumps 101 to the printed circuit board 103, resulting in a rise of a temperature of the entire mounting configuration of the electronic component. When such a rise of the temperature occurs, due to a difference in thermal expansion coefficient between the semiconductor chip 102 and the printed circuit board 103, each of the solder bumps 101 sandwiched between the solder bumps 101 and the printed circuit board 103 receives a load in a shearing direction, thus causing the occurrence of thermal stress (hereafter simply "stress") in each of the solder bumps 101. If the solder bumps 101 are arranged at equal intervals on the mounting surface of the semiconductor chip 102 as described above, the larger stress occurs in the solder bumps 101, in particular, arranged from a central portion of the semiconductor chips 102 toward a peripheral portion thereof and, therefore, the occurrence of thermal fatigue breakdown starts from the solder bumps 101 arranged in the outermost portion of the semiconductor chips 102. This results in lowering of the reliability of electronic components.

To solve this problem, an electronic component mounting configuration capable of relieving stress occurring in solder bumps by providing a contrivance to distribute solder bumps arranged in a semiconductor chip is disclosed (Patent Reference 1: Japanese Utility Model Laid-open No. Hei 03-016327). In the disclosed electronic component mounting configuration 200 as shown in FIGS. 7A and 7B, a pitch among solder bumps 201A arranged in portions at four corners of the semiconductor chip 202 is set to be $P_{12}$ and a pitch $P_{11}$ between a solder bump arranged in a central portion of the semiconductor chip 202 and the solder bumps 201A is smaller than the $P_{12}$ ($P_{11}$>$P_{12}$). By configuring as above, concentration of stress on one solder bump in portions at four corners of the semiconductor chip 202 can be avoided and, therefore, stress can be dispersed and relieved.

Also, a mounting configuration of integrated circuits is disclosed (Patent Reference 2: Japanese Patent Application Laid-open No. 2002-246404) in which, in order to uniform stress applied to protrusion electrodes when a semiconductor chip is pressed through the protrusion-shaped electrodes on a printed circuit board with pressure, the protrusion-shaped electrodes are arranged so that an entire area of the protrusion-shaped electrodes meets specified conditions. Also, another mounting configuration of integrated circuits is disclosed (Patent Reference 3: Japanese Patent Application Laid-open No. 2002-270723) in which, in order to prevent the degradation in electrical performance, lowering of reliability, decrease in manufacturing yield, increase in manufacturing costs, the distribution density of protrusion electrode groups arranged in a mounting surface of a semiconductor chip is set so as to be highest in columns near to a central portion of the semiconductor chip and to be lower in columns outside therefrom. Also, still another mounting configuration of integrated circuits is disclosed which is capable of improving reliability by taking a potential difference among protrusion-shaped electrodes arranged on an mounting surface of a semiconductor chip (Patent Reference 4: Japanese Patent Application Laid-open No. 2005-243913). Still another mounting configuration of integrated circuits is disclosed which is so configured to set a distribution density of protrusion-shaped electrodes at a specified value in order to decrease the occurrence of a short circuit among protrusion-shaped electrodes arranged on a mounting surface of a semiconductor chip (Patent Reference 5: Japanese Patent Application Laid-open No. Hei 10-004125).

However, these related mounting configurations have problems. That is, in the integrated circuit mounting configuration disclosed in the Patent Reference 2, the stress imposed on protrusion-shaped electrodes when the semiconductor chip is mounted with pressure is made to become a problem, while the stress occurring in the protrusion-shaped electrodes at the time of rising of temperatures when the integrated-circuits are operating as in the case of the present invention is not made to become a problem. In the mounting configuration of integrated circuits disclosed in the Patent Reference 3, the distribution density of protrusion electrode groups formed on the mounting surface of the semiconductor chip is set so as to become highest in columns near to a central portion of the semiconductor chip and to become lower in columns toward the outside, however, this arrangement is reverse to that employed in the present invention in which each protrusion-shaped electrode is formed so that the density of the distribution of the protrusion-shaped electrodes becomes the higher from a central portion of the mounting surface of the semiconductor chip toward a peripheral portion thereof. In the mounting configuration of integrated circuits disclosed in the Patent Reference 4, the protrusion-shaped electrodes are arranged by taking a potential difference among the protrusion-shaped electrodes into consideration in order to improve quality, however, the object of the present invention that stress occurring in protrusion-shaped electrodes at the time of rising of temperatures of an electronic component is made uniform is not sought in the related configuration. In the mounting configuration of integrated circuits disclosed in the Patent Reference 5, a distribution density of protrusion-shaped electrodes is set at a specified value in order to decrease the occurrence of a short circuit among protrusion-shaped electrodes arranged on the mounting surface of the semiconductor chip, however, the object and means disclosed in the Patent Reference 5 are different from those employed by the prevent invention.

The mounting configuration of integrated circuits disclosed in the Patent Reference 1 has the following problem. That is, the object of the semiconductor chip 202 in which the solder bumps 201 serving as protrusion-shaped electrodes are arranged only in portions surrounding the mounting surface is to relieve the stress occurring in the solder bumps formed as above. There occurs a difference in stress occurring in the protrusion-shaped electrodes at the time of rising of temperatures during operations of the integrated circuits between the semiconductor chip on which such solder bumps are arranged only in portions surrounding the mounting surface and the semiconductor chip on which the solder bumps are arranged so as to be distributed on the entire mounting surface of the semiconductor chip. Therefore, the means for solving the problem employed in the Patent Reference 1 can not be applied, as it is, to the mounting configuration of the present invention in which solder bumps are distributed all over the entire mounting surface of the semiconductor chip.

SUMMARY OF THE INVENTION

In view of the above, it is an object of the present invention to provide an electronic component mounting configuration in which an electronic component chip having a plurality of protrusion-shaped electrodes distributed on its entire mounting surface is mounted through the protrusion-shaped electrodes on a printed circuit board, which enables the improvement of reliability of the electronic component by relieving stress occurring in protrusion-shaped electrodes due to rising of temperatures during operations of the electronic component.

According to a first exemplary aspect of the present invention, there is provided a mounting configuration of an electronic component in which an electronic component chip having a plurality of protrusion-shaped electrodes distributed on its entire mounting surface is mounted through the protrusion-shaped electrodes on a printed circuit board, wherein the protrusion-shaped electrodes are arranged so that a distribution density of the protrusion-shaped electrodes becomes higher from a central portion of the mounting surface of the electrode component chip toward a peripheral portion thereof.

According to a exemplary second aspect of the present invention, there is provided a mounting configuration of an electronic component in which an electronic component chip having a plurality of solder bumps distributed on its entire mounting surface is mounted through the solder bumps onto a printed circuit board, wherein the solder bumps are arranged so that a distribution density of the solder bumps becomes higher from a central portion of the mounting surface of the electrode component chip toward a peripheral portion thereof.

BRIEF DESCRIPTION OF THE DRAWINGS

The above and other objects, advantages, and features of the present invention will be more apparent from the following description taken in conjunction with the accompanying drawings on which:

FIG. 1A is a plan view schematically showing configurations of a rear surface of a semiconductor chip and FIG. 1B is a cross-sectional view showing the mounting configuration of FIG. 1A taken along a line A-A.

FIG. 5A is a plan view schematically showing configurations of a rear surface of a semiconductor chip and FIG. 5B is a cross-sectional view showing the mounting configuration of FIG. 5A taken along a line B-B;

FIG. 7A is a plan view schematically showing configurations of a rear surface of a semiconductor chip and FIG. 7B is a cross-sectional view showing the mounting configuration of FIG. 7A taken along a line C-C.

DETAILED DESCRIPTION OF THE PREFERRED EXEMPLARY EMBODIMENTS

Figure 1A:
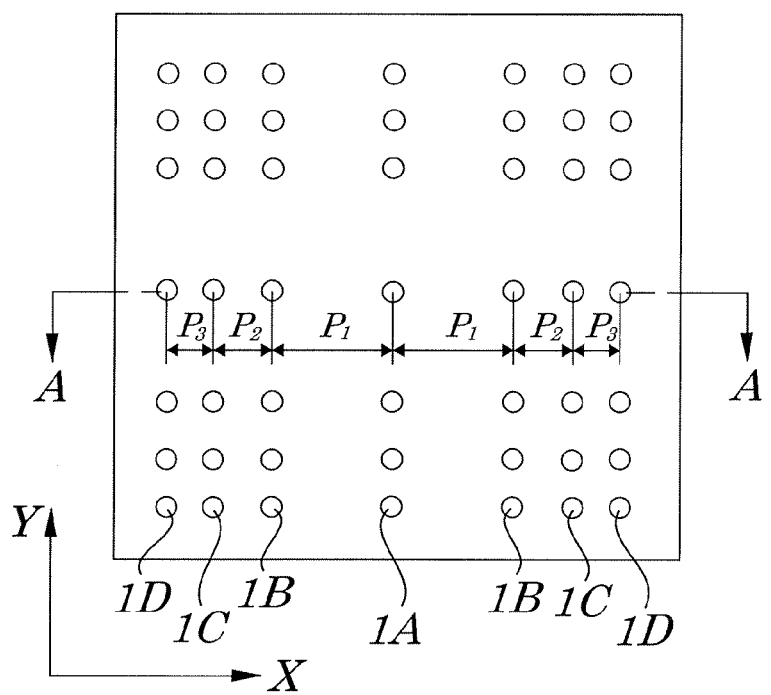
FIGS. 1A and 1B are diagrams showing a mounting configuration of an electronic component according to a first exemplary embodiment of the present invention.
Figure 1B:
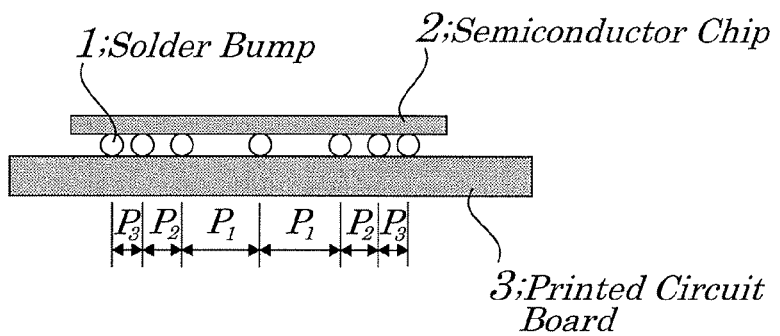

Best modes of carrying out the present invention will be described in further detail using various exemplary embodiments with reference to the accompanying drawings. In an electronic component mounting configuration 10 of the present invention, as shown in FIGS. 1A and 1B, the semiconductor chip 2 in which a plurality of solder bumps 1 (1A to 1D) is arranged so as to be distributed on its entire mounting surface in two-dimensional directions (X and Y directions) is mounted through the solder bumps 1 on the printed circuit board 3 and the solder bumps 1 are arranged so that intervals between the solder bumps 1 being adjacent to one another become smaller from a central portion of a mounting surface of the semiconductor chips 2 toward the peripheral portion thereof. For example, an interval between the solder bump 1A arranged in the central portion of the semiconductor chip 2 and each of the solder bumps 1B arranged toward the outside therefrom is set to a pitch of P1 and an interval between the solder bump 1B and the solder bump 1C formed toward the outside is set to a pitch of P2, and an interval between the solder bump 1C and the solder bump 1D is set to a pitch of P3 (here, P1>P2>P3).

With the above configuration, the plurality of solder bumps is arranged so that a density of distribution of the solder bumps becomes higher from the central portion of the mounting surface of the semiconductor chip toward the peripheral portion thereof. Therefore, the distribution of stress occurring in the plurality of solder bumps can be made uniform among the solder bumps, it is made possible to improve reliability of the electronic component by relieving stress occurring in the solder bumps due to rising of temperatures during operations of the electronic component.

First Exemplary Embodiment

FIGS. 1A and 1B are diagrams showing a mounting configuration of an electronic component according to the first exemplary embodiment of the present invention and FIG. 1A is a plan view schematically showing configurations of a rear surface of an electronic component chip and FIG. 1B is a cross-sectional view showing the mounting configuration of FIG. 1A taken along the line A-A. In the first exemplary embodiment, an integrated circuit is employed as an electronic component and the semiconductor chip as the electronic component chip. Moreover, solder bumps (1A to 1D) described later is employed as a protrusion-shaped electrode.

In the electronic component mounting configuration 10 of the first exemplary embodiment, as shown in FIGS. 1A and 1B, the semiconductor chip 2 in which a plurality of solder bumps (1A to 1D) is arranged so as to be distributed on its entire mounting surface in two-dimensional directions (X and Y directions) is mounted through the solder bumps 1 onto the printed circuit board 3 and the solder bumps 1 are arranged so that intervals between the solder bumps 1 being adjacent to one another become smaller from a central portion of a mounting surface of the semiconductor chip 2 toward the outside therefrom.

In the first exemplary embodiment, seven pieces of the solder bumps 1 are arranged in each of the X and Y directions (in the two-dimensional directions). Now, as one example, one column in the X direction is described. An interval between the solder bump 1A arranged in the central portion of the semiconductor chip 2 and the solder bump 1B arranged in an outer side thereof, adjacent to each other, is set to a pitch of P1. An interval between the solder bump 1B and the solder bump 1C formed in an outer side thereof, adjacent to each other, is set to a pitch of P2 and an interval between the solder bump 1C and the solder bump 1D in an outer side thereof, adjacent to each other, is set to a pitch of P3 (here, P1>P2>P3). That is, the plurality of solder bumps 1 is arranged so that a density of distribution of the solder bumps 1 becomes higher from the central portion of the semiconductor chip 2 toward the peripheral portion thereof.

To arrange the plurality of solder bumps 1 as above, each pitch can be determined by using an arithmetic progression or geometric progression. The use of the geometric progression enables the degree to which the distribution density of solder bumps 1 becomes higher to be made large when compared with the use of the arithmetic progression.

By arranging the plurality of solder bumps 1 so that the distribution density of the solder bumps 1 becomes higher from the central portion of the semiconductor chip 2 toward the peripheral portion thereof, it is made possible to uniform the distribution of stress occurring in the plurality of solder bumps 1 all over the solder bumps 1. That is, since more solder bumps 1 are arranged in portions further toward the peripheral portion of the mounting surface of the semiconductor chip 2, the stress to be shared by one solder bump 1 is made uniform all over the solder bumps 1. Therefore, in the related configuration in which the plurality of solder bumps is arranged at equal intervals with a specified pitch, the occurrence of larger stress cannot be avoided in the solder bumps arranged from the central portion of the semiconductor chip toward the peripheral portion thereof. However, according to the first exemplary embodiment of the present invention, the distribution of stress to be made uniform all over the solder bumps 1 and, as a result, the stress occurring in the solder bumps 1 due to rising of temperatures during operations of the integrated circuits, which enables the improvement of reliability of integrated circuits.

Figure 2:
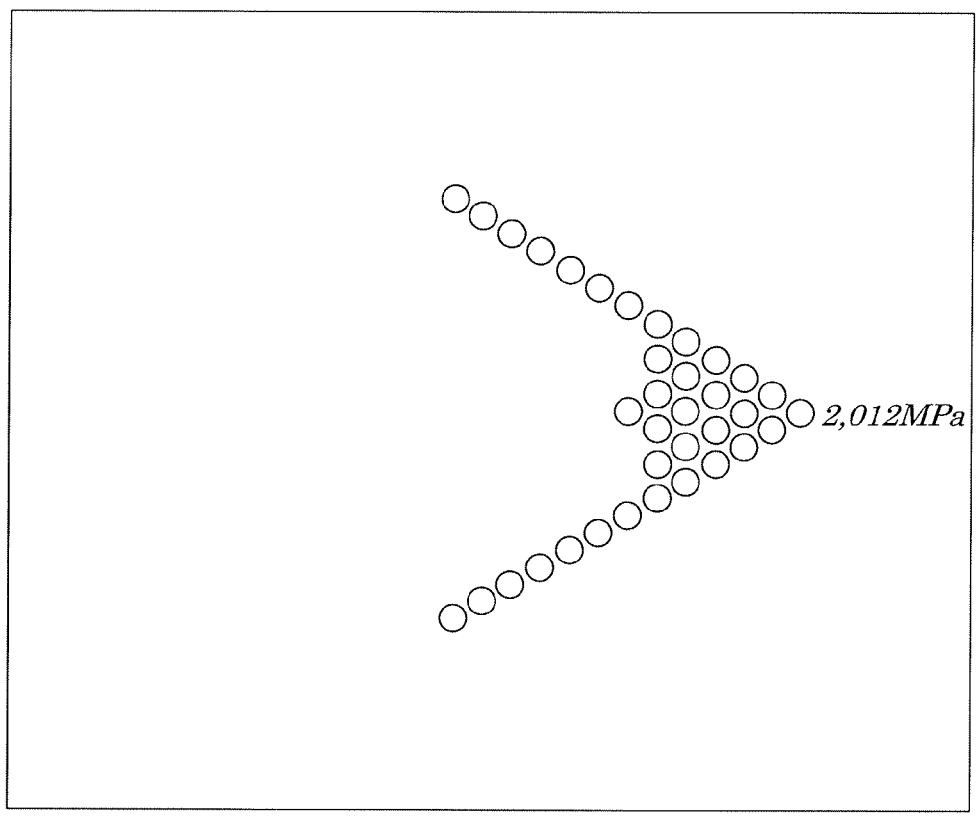
FIG. 2 is a diagram showing results from a thermal stress simulation on the mounting configuration of the electronic component according to the first exemplary embodiment of the present invention.

FIG. 2 is a diagram showing results from a simulation of thermal stress performed on the electronic component mounting configuration 10 of the first exemplary embodiment of the present invention, which are shown by a contour diagram of thermal stress occurring in the solder bumps 1 when an operating temperature of an integrated circuit drops from 150° C. to 25° C. In FIG. 2, the symbol "O" schematically shows solder bumps. In order to obtain calculation results corresponding to the mounting configuration using the semiconductor chip being as actual as possible, not the semiconductor chip on which the small and limited number of solder bumps 1 are arranged as shown in FIGS. 1A and 1B but the mounting configuration in which a few hundred to a few thousand solder bumps being near to the actual number are used for the simulation of thermal stress. Moreover, to simplify the calculation, the simulation was performed by reducing the number of solder bumps to 144 pieces (12×12) and by taking the symmetrical property of the mounting configuration into consideration and by modeling one quarter portion of the semiconductor chip.

Figure 5A:
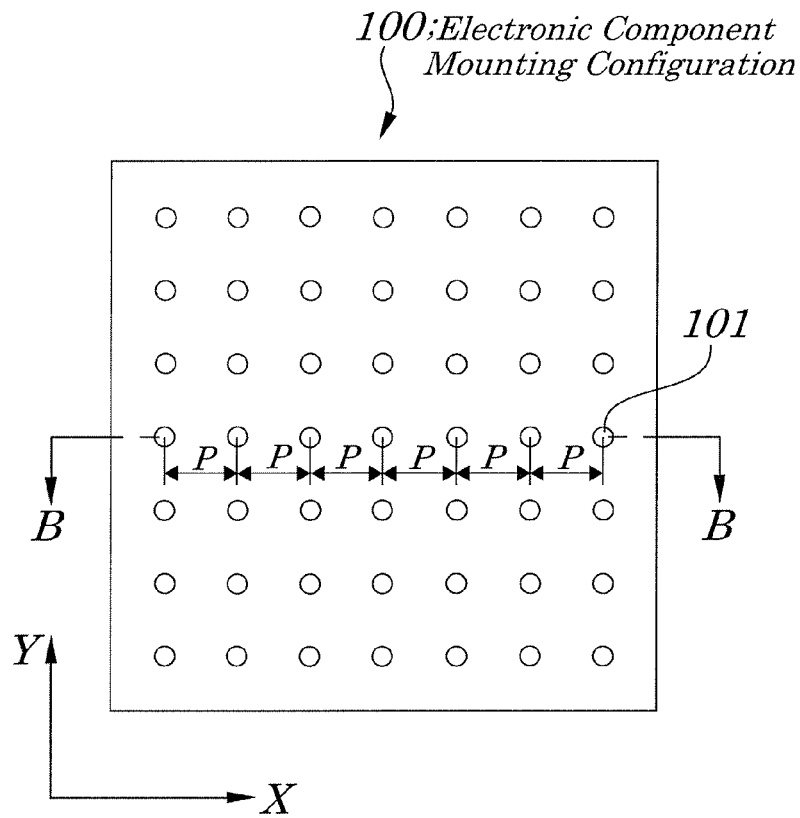
FIGS. 5A and 5B are diagrams showing a related mounting configuration of an electronic component using a flip chip method.
Figure 5B:
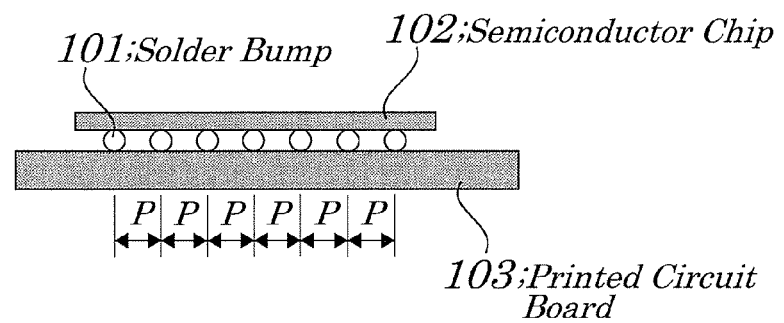
Figure 7A:
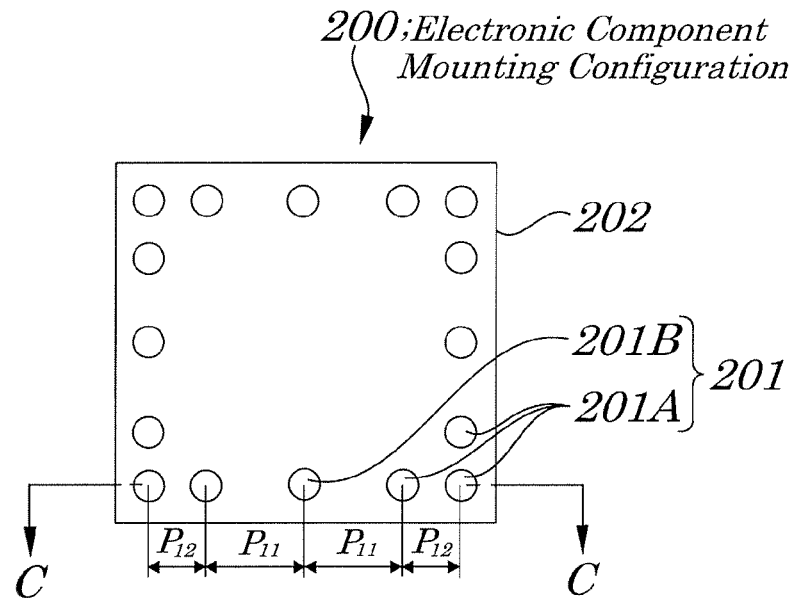
FIGS. 7A and 7B are diagrams showing a related mounting configuration of an electronic component using a flip chip method.
Figure 7B:
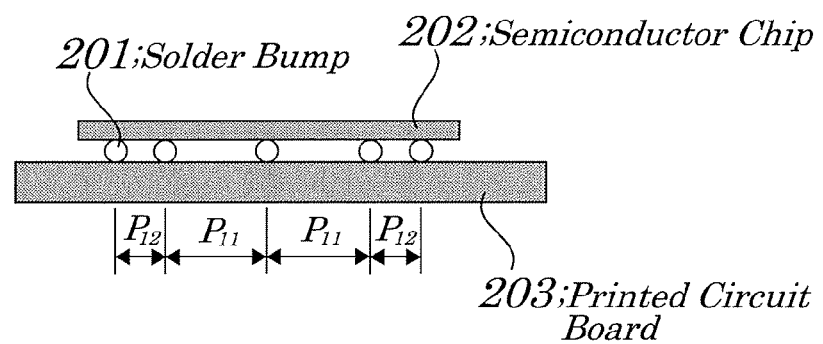

The value of thermal stress obtained by the thermal stress simulation is about 2,012 MPa (Mega Pascal). On the other hand, the value of thermal stress obtained by the thermal stress simulation on the related mounting configuration shown in FIG. 5 is about 3,285 MPa. For comparison, assuming that the value of thermal stress obtained by the simulation on the related configuration is 1, the maximum value of the electronic component mounting configuration 10 of the present invention is about 0.61 (2,012/3,285), which shows that about 40% of thermal stress in the related configuration can be reduced by employing the mounting configuration of the present invention. Moreover, the value of thermal stress obtained by performing a simulation of thermal stress on the related mounting configuration shown in FIGS. 7A and 7B for comparison was about 2,504 MPa shown in FIG. 8. If the simulation is performed on the related mounting configuration in which solder bumps are arranged only in portions surrounding the semiconductor chip, a correct comparison with the results from the simulation on the electronic component mounting configuration 10 of the present invention becomes difficult and, therefore, the solder bumps of the related mounting configuration were virtually distributed on the entire mounting surface of the semiconductor chip and the simulation was performed on both the mounting configurations. Here, assuming that the value of thermal stress obtained by the simulation on the related configuration is 1, the maximum value of the electronic component mounting configuration 10 of the present invention is about 0.80 (2,012/2,504), which shows that about 20% of thermal stress in the related configuration can be reduced by employing the mounting configuration of the present invention.

Thus, according to the electronic component mounting configuration 10 of the present invention, the semiconductor chip 2 in which a plurality of the solder bumps 1 (1A to 1D) are arranged in each of the X and Y directions (in the two-dimensional directions) so as to be distributed on the entire mounting surface of the semiconductor chip 2 is mounted through the solder bumps 1 onto the printed circuit board 3 and, for example, the interval between the solder bump 1A formed in the central portion of the semiconductor chip 2 and the solder bump 1B arranged in an outer side thereof, adjacent to each other, is set to a pitch of P1 and the interval between the solder bump 1B and the solder bump 1C formed in an outer side thereof, adjacent to each other, is set to a pitch of P2 and the interval between the solder bump 1C and the solder bump 1D in an outer side thereof, adjacent to each other, is set to a pitch of P3 (here, P1>P2>P3). Therefore, the solder bumps 1 are arranged so that intervals between the solder bumps 1 adjacent to one another become small from the central portion of the semiconductor chip 2 toward the peripheral portion thereof and, as a result, the distribution density of the solder bumps 1 becomes higher. Thus, the distribution of stress occurring in the plurality of solder bumps can be made uniform all over the solder bumps, thereby enabling the stress caused by rising of temperatures during operations of an electronic component to be relieved and, therefore, it is made possible to improve the reliability of electronic components.

Second Exemplary Embodiment

Figure 3:
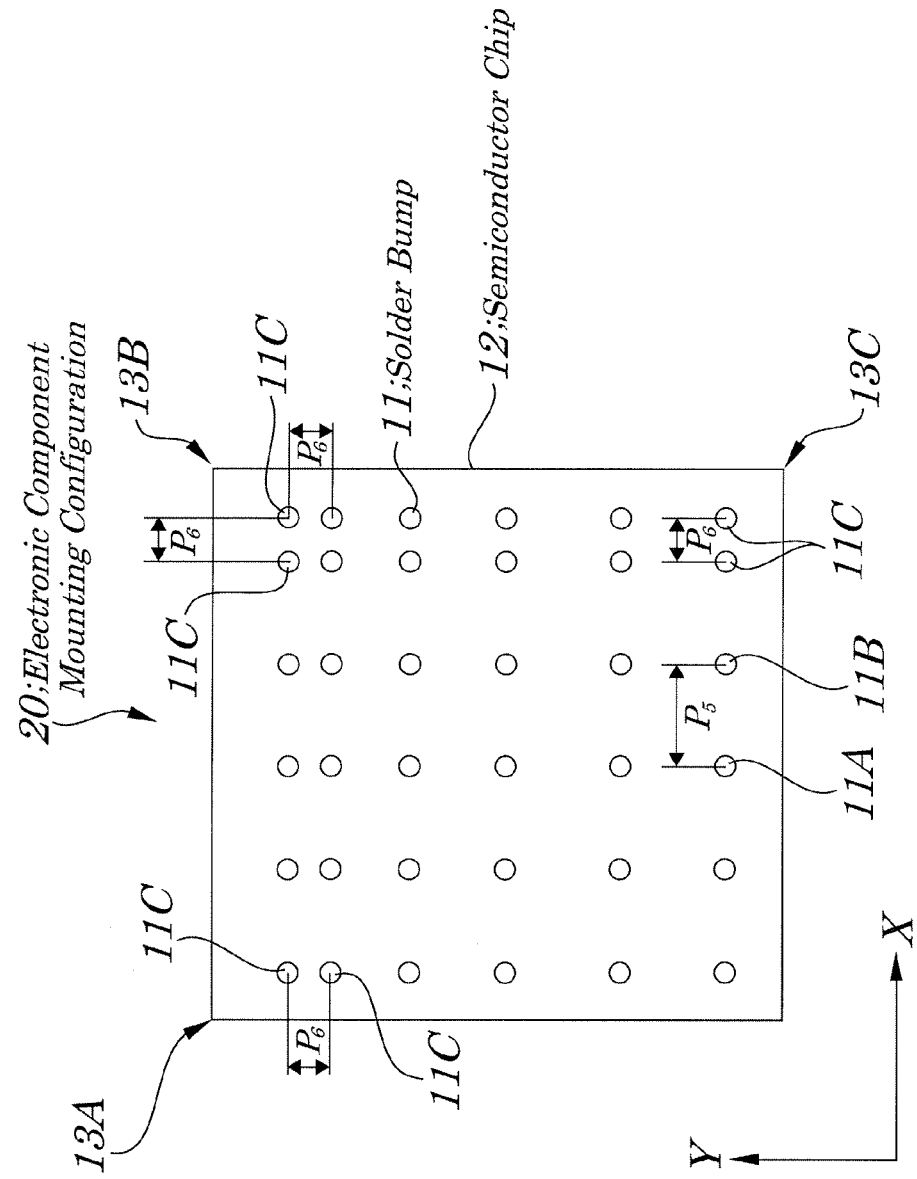
FIG. 3 is a plan view schematically showing a rear of an electronic component chip to be used in a mounting configuration of an electronic component according to a second exemplary embodiment of the present invention.

FIG. 3 is a plan view schematically showing a rear surface of an electronic component chip to be used in an electronic component mounting configuration according to the second exemplary embodiment of the present invention. The electronic component mounting configuration of the second exemplary embodiment differs from that of the first exemplary embodiment in that a plurality of solder bumps is arranged, with a small pitch, in portions surrounding amounting surface of a semiconductor chip. In the electronic component mounting configuration 20 of the second exemplary embodiment, as shown in FIG. 3, a semiconductor chip 12 on which a plurality of solder bumps 11 is arranged in two-dimensional direction (X and Y directions) so as to be distributed all over the mounting surface is mounted through solder bumps 11 onto a printed circuit board. Each of the solder bumps 11A formed in a central portion of the mounting surface and each of the solder bumps 11B formed on an outer portion, each other, are arranged at intervals with a pitch of $P_5$ and, in outer portions 13A, 13B and 13C of the mounting surface, the solder bumps 11C are arranged at intervals with a pitch of $P_6$ (here, pitch $P_5$>pitch $P_6$). A reference number 13B in FIG. 3 denotes a corner region of the mounting surface, and reference numbers 13A and 13C each denote a region between the corner regions of the mounting surface.

Thus, even in the electronic component mounting configuration 20, the plurality of solder bumps 11 are arranged so that the distribution density of the bumps 11 become higher from a central portion of the semiconductor chip 12 toward the peripheral portion thereof.

Figure 4:
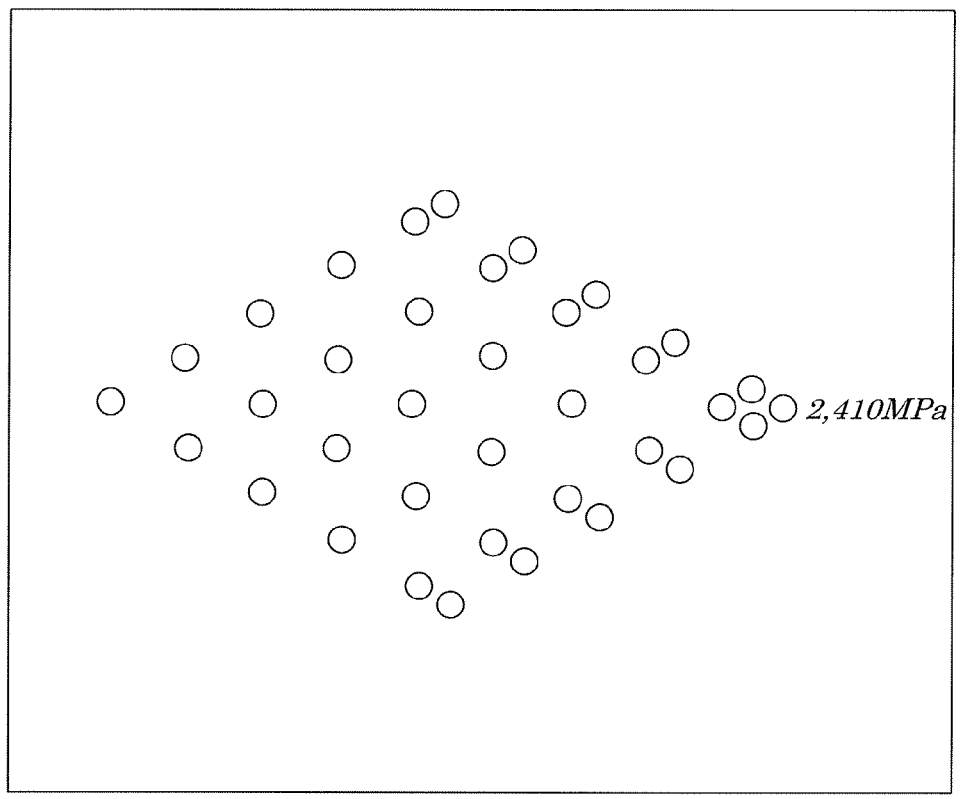
FIG. 4 is a diagram showing results from a thermal stress simulation on the mounting configuration of the electronic component according to the second exemplary embodiment of the present invention.
Figure 6:
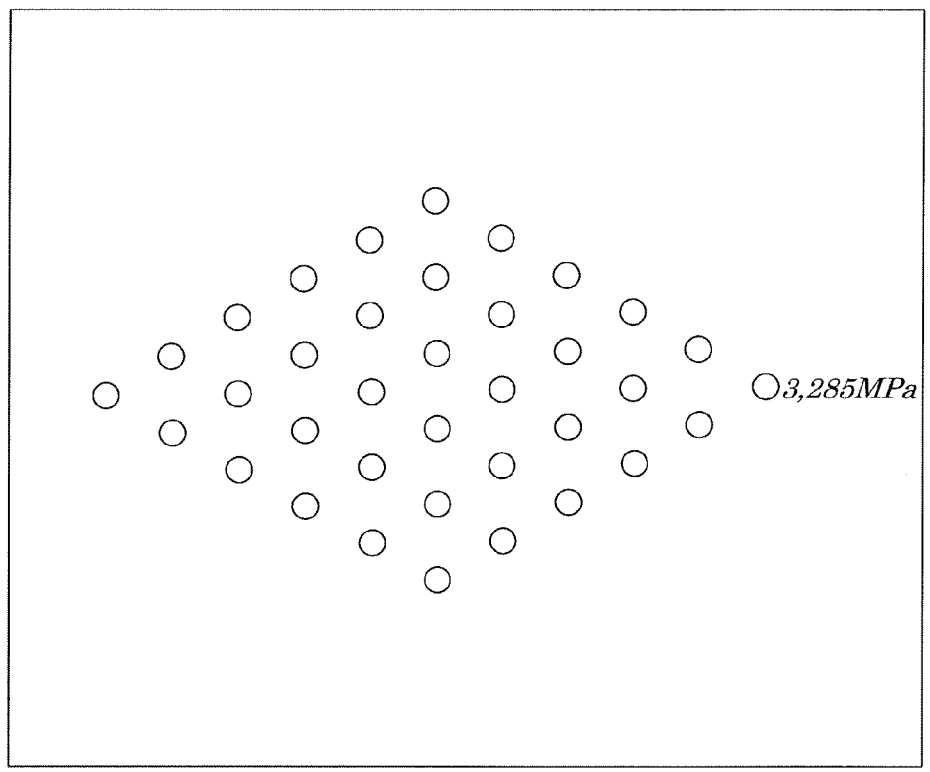
FIG. 6 is a diagram showing results from a thermal stress simulation on the related mounting configuration of the electronic component.

FIG. 4 is a diagram showing results from a thermal stress simulation performed on the electronic component mounting configuration 20 and the obtained value of thermal stress was about 2,410 MPa. Assuming that the value of thermal stress obtained by the simulation on the related configuration shown in FIG. 6 is 1, the maximum value of the electronic component mounting configuration 20 of the present invention is about 0.73 (2,410/3,285), which shows that about 27% of thermal stress in the related configuration can be reduced by employing the configuration of the present invention.

Figure 8:
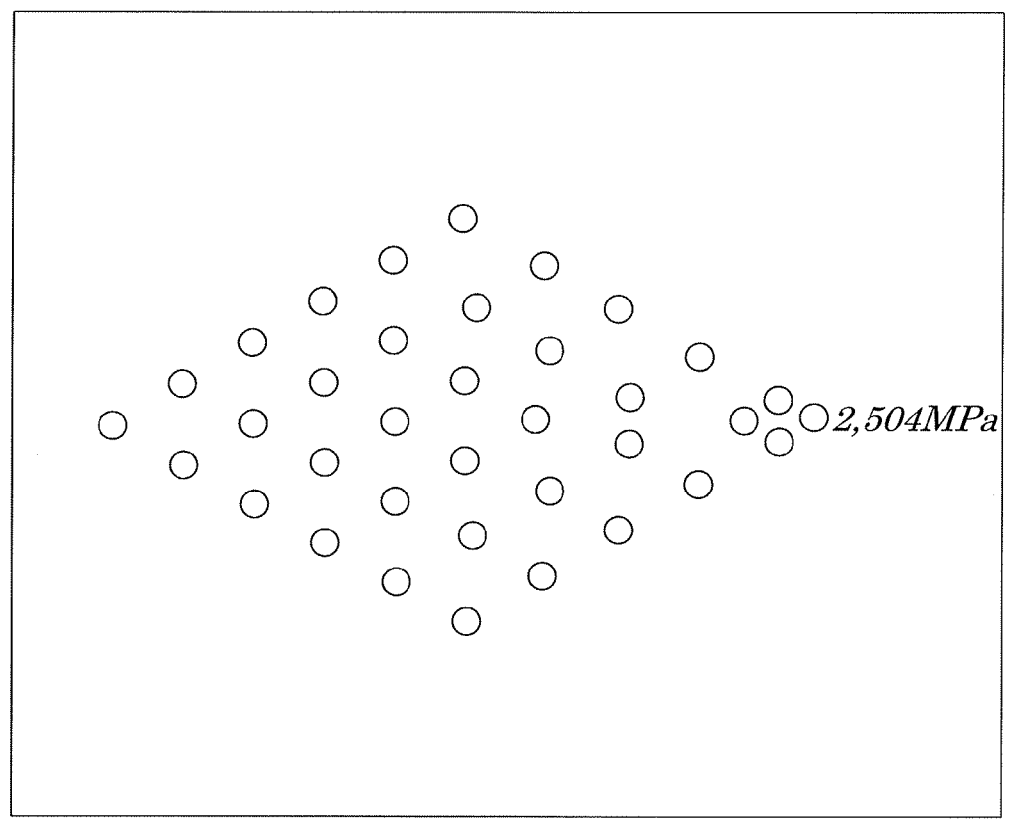
FIG. 8 is a diagram showing results from a thermal stress simulation on the related mounting configuration of the electronic component.

Assuming that the value of thermal stress obtained by the simulation on the related configuration shown in FIG. 8 is 1, the maximum value of the electronic component mounting configuration 20 of the present invention is about 0.96 (2,410/2,504), which shows that about 4% of thermal stress in the related configuration can be reduced by employing the configuration of the present invention.

Thus, even in the electronic component mounting configuration 20 of the exemplary embodiment, the plurality of solder bumps 11 are arranged so that the distribution density of the bumps 11 becomes higher from a central portion of the semiconductor chip 12 toward the peripheral portion thereof and, therefore, approximately the same effect as achieved in the first exemplary embodiment can be obtained.

While the invention has been particularly shown and described with reference to exemplary embodiments thereof, the invention is riot limited to theses embodiments. It will be understood by those of ordinary skill in the art that various changes in form and details may be made therein without departing from the sprit and scope of the present invention as defined by the claims. For example, to understand the description of the present invention more readily, the small and limited number of solder bumps serving as the protrusion-shaped electrodes are used in the above exemplary embodiments, however, in an actual semiconductor chip of integrated circuits, a few hundred to a few thousand solder bumps are generally arranged and the present invention can be applied to such solder bumps. Also, instead of the solder bumps, other electrode terminals such as a micropin may be used. Moreover, in the above exemplary embodiments, the solder bumps as protrusion-shaped electrodes are used, however, not only the solder bumps but also conductors of such as Au (gold), Ag (silver), Cu (copper), or a like, or a conductive adhesive or a like may be used. The present invention may be applied to any electronic component in addition to an integrated circuit such as a capacitor, resistor, or a like so long as a plurality of protrusion-shaped electrodes is used. When the protrusion-shaped electrodes are arranged so that the distribution density becomes higher from a central portion of an electronic component chip toward the peripheral portion thereof, the use of an arithmetic progression or geometric progression is not necessarily required. The protrusion-shaped electrodes need not to be arranged regularly and may be randomly formed at a position required for operations of a semiconductor chip so long as the condition is satisfied that the density of the distribution of the protrusion-shaped electrodes becomes higher from a central portion of an electronic component chip toward the peripheral portion thereof.

In the foregoing first and second aspects of the present invention, a preferable mode is one wherein the protrusion-shaped electrodes (solder bumps) are arranged so that intervals between solder bumps adjacent to one another become smaller from a central portion of a mounting surface of the electronic component chip toward the peripheral portion thereof.

Also, a preferable mode is one wherein a plurality of protrusion-shaped electrodes (solder bumps) is arranged in portions surrounding the mounting surface of the electronic component chip so that intervals between the plurality of protrusion-shaped electrodes (solder bumps) are smaller than intervals between the protrusion-shaped electrodes formed in the central portion of the mounting surface.

Also, a preferable mode is one wherein the electronic component chip includes a semiconductor chip.

What is claimed is:

1. A semiconductor chip, comprising:
    a plurality of protrusion-shaped electrodes distributed on a central portion and on a peripheral portion of a mounting surface of said semiconductor chip,
    wherein said semiconductor chip is mounted through said protrusion-shaped electrodes onto a printed circuit board,
    wherein said protrusion-shaped electrodes are arranged in rows all over said mounting surface such that each subsequent space between adjacent protrusion-shaped electrodes in a row in the central portion and a row in the peripheral portion becomes less from a center toward an edge of each of the rows according to a rule of an arithmetic progression or a geometric progression,
    wherein a distribution surface density of said protrusion-shaped electrodes corresponds to a size of a rectangular region including only four protrusion-shaped electrodes adjacent to each other, each electrode making up one corner thereof; and
    wherein said protrusion-shaped electrodes are arranged so that each corresponding rectangular region becomes smaller in size as a location of the rectangular region moves from the central portion toward the peripheral portion of the mounting surface.

2. The semiconductor chip according to claim 1, wherein said plurality of protrusion-shaped electrodes is arranged in portions surrounding said mounting surface of said semiconductor chip so that the subsequent space between adjacent protrusion-shaped electrodes formed in the peripheral portion are smaller than the corresponding subsequent space in a same column between adjacent protrusion-shaped electrodes formed in the central portion of said mounting surface.

3. A mounting configuration of an electronic component in which a semiconductor chip having a plurality of solder bumps distributed on a central portion and on a peripheral portion of a mounting surface of said semiconductor chip,
    wherein said semiconductor chip is mounted through said solder bumps onto a printed circuit board,
    wherein said solder bumps are arranged in rows all over said mounting surface such that each subsequent space between adjacent solder bumps in a row passing through the central portion of said mounting surface and a row passing through the peripheral portion of said mounting surface becomes is less from a center toward an edge of each of the rows according to a rule of an arithemetic progression or geometric progression,
    wherein a distribution surface density of said solder bumps corresponds to a size of a rectangular region including only four solder bumps adjacent to each other, each solder bump making up one corner thereof, and
    wherein said solder bumps are arranged so that each corresponding rectangular region becomes smaller in size as a location of said rectangular region moves from the central portion of the mounting surface of said electrode component chip toward the peripheral portion of the mounting surface.

4. The mounting configuration of an electronic component according to claim 3, wherein said plurality of solder bumps is arranged in portions surrounding said mounting surface of said semiconductor chip so that intervals between said plurality of solder bumps are smaller than intervals between said solder bumps formed in the central portion of said mounting surface.

* * * * *